United States Patent [19]

Reiter et al.

[11] Patent Number: 5,173,328

[45] Date of Patent: * Dec. 22, 1992

[54] PLASMA CVD PROCESS FOR COATING A BASIC METALLIC BODY WITH A NON-CONDUCTIVE COATING MATERIAL

[75] Inventors: Norbert Reiter, Mettmann; Udo König, Essen, both of Fed. Rep. of Germany; Hendrikus Van Den Berg, Venlo-Blerick, Netherlands; Ralf Tabersky, Bottrop, Fed. Rep. of Germany

[73] Assignee: Krupp Widia GmbH, Essen, Fed. Rep. of Germany

[*] Notice: The portion of the term of this patent subsequent to Mar. 3, 2009 has been disclaimed.

[21] Appl. No.: 700,203

[22] PCT Filed: Nov. 27, 1989

[86] PCT No.: PCT/DE89/00739

§ 371 Date: May 31, 1991

§ 102(e) Date: May 31, 1991

[87] PCT Pub. No.: WO90/06380

PCT Pub. Date: Jun. 14, 1990

[30] Foreign Application Priority Data

Dec. 10, 1988 [DE] Fed. Rep. of Germany ....... 3841730

[51] Int. Cl.$^5$ .......................... B05D 3/06; C23C 16/00
[52] U.S. Cl. ................. 427/576; 427/126.3; 427/126.1; 427/126.4
[58] Field of Search ............. 427/39, 38, 126.3, 126.4, 427/126.1; 118/723

[56] References Cited

U.S. PATENT DOCUMENTS

| | | | |
|---|---|---|---|
| 3,677,799 | 7/1972 | Hou | 427/38 |
| 4,500,563 | 2/1985 | Ellenberger et al. | 427/38 |
| 4,675,206 | 6/1987 | Ikegaya | 427/38 |
| 4,915,977 | 4/1990 | Okamoto et al. | 427/37 |
| 5,013,578 | 5/1991 | Brown et al. | 427/37 |

FOREIGN PATENT DOCUMENTS

| | | |
|---|---|---|
| 0154482 | 9/1985 | European Pat. Off. . |
| 0154483 | 9/1985 | European Pat. Off. . |
| 0207767 | 1/1987 | European Pat. Off. . |
| 59-43989 | 10/1984 | Japan . |
| 2105729 | 3/1983 | United Kingdom . |

OTHER PUBLICATIONS

Bonifield, "plasma assisted chemical vapor deposition" from Deposition Technologies for films and coatings edited by Bunshah et al, Noyes Publications, NJ, 1982 pp. 365-368, pp. 381-384.

6001 Chemical Abstracts, 102(1985) Mar., No. 12, Columbus, OH US.

Primary Examiner—Shrive Beck
Assistant Examiner—Roy V. King
Attorney, Agent, or Firm—Herbert Dubno

[57] ABSTRACT

A process for coating a basic metallic substrate with a non-metallic coating layer with a plasma-activated CVD deposition generated by applying a pulsed DC voltage between the substrate and another electrode and by maintaining a potential of residual DC voltage between pulses of the applied voltage.

9 Claims, No Drawings

PLASMA CVD PROCESS FOR COATING A BASIC METALLIC BODY WITH A NON-CONDUCTIVE COATING MATERIAL

CROSS REFERENCE TO RELATED APPLICATIONS

This application is a national phase application of PCT/DE89/00739 filed Nov. 27, 1989 and based upon a German Application P 384 17 309 filed Dec. 10, 1988 under the International Convention.

FIELD OF THE INVENTION

The present invention relates to a process for coating a basic metallic body with a non-conductive coating material, particularly ceramic ($Al_2O_3$), by means of plasma-activated CVD deposition.

BACKGROUND OF THE INVENTION

It is known that the life span and the reliability of a workpiece made of tool steel can be considerably improved when the workpiece is coated with a wear-resistant layer. It has already been described in the German publication "VDI-Z" 124 (1982) No. 18, September (II) on page 693, that borides, carbides and nitrides of transition metals, especially titanium carbide or titanium nitride in a thin layer on tool steel improve considerably the life span and reliability of the workpiece.

A suitable process for the coating is the deposition of a chemically reactive gas mixture by CVD (CVD=chemical vapor deposition). Thereby, gaseous compounds containing the elements constituting the layer to be formed by deposition are caused to react with each other at high temperatures. For the deposition of titanium carbide, for example, gaseous titanium chloride ($TiCl_4$) is reduced in the presence of methane ($CH_4$) with hydrogen ($H_2$) as a reducing agent and carrier gas. For the titanium nitride deposition, nitrogen ($N_2$) is used instead of methane.

Further, it is known to use ceramic $Al_2O_3$ based coating materials as the layer of hard material on hard metals, when very high cutting speeds are required in cutting tools. The advantages of a ceramic coating include especially high hardness and heat resistance, a high compressive strength at elevated temperatures, high thermodynamic stability and high chemical resistance. The deposited aluminum oxide is mostly present in the crystalline structure $\alpha$-$Al_2O_3$-corundum. As known, all allotropic changes of $Al_2O_3$ which result in intermediate stages during the dehydration of the numerous aluminum hydrates tend at high temperatures towards the basic structure of corundum. Since some of these allotropic changes, among others the theta -$Al_2O_3$, are stable up to temperatures as high as 1200° C., sometimes, besides the corundum, it is possible to find these allotropic stages in the deposited layer as well. However, research has shown that between $\alpha$- and theta-$Al_2O_3$ coatings there are no noticeable differences in the cutting (machining) properties of the metal.

However, the drawback of the CVD-coating remains the heretofore required high coating temperature of approximately 1000° C., which leads to losses in the tenacity of the respective composite body. The efforts to develop low-temperature CVD-processes for basic steel bodies, wherein the crystalline growth in the steel as well as a stabilization of the austenite phase can be avoided have lead to the plasma-activated coating process, wherein the reaction gas is superimposed on a non-balanced plasma in a low-pressure glow discharge. Thereby, the temperature of the electrons is considerably higher than the temperature of the ions and neutrons. Compared to a gas in a state of the thermodynamic balance at the same temperature, due to essentially higher energy of the described non-balanced plasma, chemical reactions become possible for which normally much higher temperatures are required.

Low-pressure plasma can be produced in the following different ways:
by applying a constant direct-current voltage to a workpiece functioning as cathode;
by a high-frequency alternating-current voltage; and p0 by a pulsed direct-current voltage (as a consequence of rectangular pulses).

High-frequency pulses can supply inductive or capacitive energy to the reaction vessel for the deposition of very clean layers in electrotechnology (electronics), e.g. for microchips. Since it works with electrodes which are not directly connected to the substrate, it does not matter whether the material itself is conductive or non-conductive. The disadvantage is that this process is very expensive.

The simple way to produce a low-pressure charge is to have the workpiece to be coated set up as cathode and to use the container or its walls as the anode or ground potential. The temperature of the substrate is thereby a function of the voltage and the current.

A further possibility for the plasma-CVD-coating is offered by the plasma-pulse process. Thereby, the temperature of the substrate is a function of the peak voltage and the peak current, as well as of the duration and frequency of the pulses. Advantageously, the temperature of the substrate can be set independently of the parameters of the low-pressure glow discharge the voltage and the current. However, just like in the case of the aforedescribed processes working with a constant direction current, up to now the plasma-pulse process has been used only on metallic conductive materials, e.g. a titanium nitride or titanium carbide coating.

The coating with ceramic layers ($Al_2O_3$) is carried out according to the state of the art for instance by a so-called PVD-process (PVD=physical vapor deposition). As an example of the PVD-process cathodic disintegration is mentioned. Thereby, in a glow discharge the material of the cathode disintegrates under the impact of positive ions upon the cathode surface. It is generally known that a coating with titanium carbide is extremely difficult to achieve by cathodic disintegration, since the carbon disturbs the process. As a result, in ceramic deposition by cathodic disintegration only amorphous phases can be obtained.

OBJECTS OF THE INVENTION

It is therefore the object of the present invention to provide a cost-efficient and technically simple process for the production of composite materials consisting of a basic metallic body and one or several layers, of which at least one is non-conductive.

Still another object of the present invention is to provide the composite body with good wear resistance characteristics, making possible its use as a tool for cutting and non-cutting shading of metallic workpieces.

SUMMARY OF THE INVENTION

These objects are achieved by plasma activation at the basic body set up as a cathode, the plasma being generated by a pulsed direct-current voltage. Surprisingly, it has been found that contrary to the heretofore established belief that the coating material must also be conductive, a coating with, for instance, aluminum oxide can be carried out even when a pulsed direct-current voltage is used. This is surprising and unexpected, since the basic metallic body starts to cover itself with a non-conductive layer of $Al_2O_3$ only a few minutes after the process begins, and the thickness of this layer continues to increase proportionally with time. As has already been mentioned above, particularly with this process it is possible to work with low temperatures. Preferably temperatures of 400° to 800° C., and according to a further development of the invention, of even less than 600° C. can be selected. The pulsed direct-current voltage has peak values between 200 and 900 volt.

The quality of the coating is further improved by the fact that between the positive direct-current pulses (rectangular pulses) and the pulse pauses, a residual direct-current voltage is maintained, which is hither than the ionization potential of the gas molecules participating in the CVD-process, but not higher than 50% of the peak value of the pulsed direct-current voltage. This technique does not depend upon voltage variations or the uniformity of the residual direct-current voltage, but rather upon the fact that over the entire time interval between two rectangular pulses the residual direct-current voltage remains always higher than the mentioned ionization potential. In the following a few of the decisive ionization potentials are indicated:

H: 13.5 eV, $H_2$: 15.8 eV, N: 14,5 eV, $N_2$: 15.7 eV and Ar: 15.7 eV, O: 13.6 eV, $O_2$: 12.1 eV.

According to a further feature of the invention the ratio of the residual direct-current voltage to the maximal value of the pulsed direct-current voltage ranges between 0.02 and 0.5.

The cycle of the pulsed direct-current voltage should range preferably between 20 $\mu$s and 20 ms, each cycle including one rectangular pulse and a pulse pause. Preferably, the ratio of the pulse duration to the length of the pulse pause is selected between 0.1 to 0.6. Finally, the parameters are set so that they insure a layer-growth speed of 0.5 to 10 $\mu$m/h.

The process according to the invention allows a multilayered coating by using various hard materials. Hard materials include carbides, nitrides, borides, silicides and oxides with a special hardness and a high melting point, e.g. titanium carbide, titanium nitride, titanium carbonitride, aluminum oxide, zirconium oxide, boron carbide, silicon carbide and titanium diboride. It is possible to product turning tools with a basic steel body and a succession of layers of TiN and/or TiC and $Al_2O_3$, for instance each layer having a thickness of 5 $\mu$m $\mu$m (TiN, TiC), or 0.3. $\mu$m ($Al_2O_3$). The turning tool has considerably improved wear-resistance characteristics.

We claim:

1. A plasma-assisted CVD process for coating a basic metallic substrate, said process comprising the steps of:
    (a) producing a reactive vapor of a nonmetallic ceramic coating substance; and
    (b) generating a plasma by applying a pulsed DC voltage having a peak value between said substrate formed as a cathode and another electrode, thereby plasma activating said substrate and depositing said coating substance on said substrate;
    wherein between pulses of said DC voltage, a potential of residual DC voltage is maintained higher than a lowest ionization potential of said vapor but not exceeding 50% of said peak value of pulsed DC voltage.

2. Process according to claim 1, characterized in that said coating substance is deposited at a temperature between 400° and 800° C.

3. Process according to claim 1, characterized in that the pulsed DC voltage reaches peak values between 200 and 900 volts.

4. Process according to claim 1, characterized in that said pulses are positive rectangular pulses.

5. Process according to claim 1, characterized in that the ratio of the residual DC voltage to the peak value of the pulsed DC voltage ranges between 0.2 and 0.5.

6. Process according to claim 1, characterized in that the duration of a cycle of the pulsed DC voltage ranges between 20 $\mu$s and 20 ms.

7. Process according to claim 1, characterized in that the ratio of the pulse length to the length of the pulse pause ranges between 0.1 and 0.6.

8. Process according to claim 1, characterized in that the deposition rate of said coating substance ranges between 0.5 and 10 $\mu$m/h.

9. The process defined in claim 1 wherein said coating substance is $Al_2O_3$.

* * * * *